United States Patent
Fan et al.

(10) Patent No.: US 9,435,933 B2
(45) Date of Patent: Sep. 6, 2016

(54) LIGHT SOURCE MODULE AND ELECTRONIC DEVICE

(71) Applicant: HTC Corporation, Taoyuan County (TW)

(72) Inventors: Fu-Cheng Fan, Taoyuan County (TW); Chih-Jen Hu, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 14/177,232

(22) Filed: Feb. 11, 2014

(65) Prior Publication Data

US 2014/0332830 A1     Nov. 13, 2014

Related U.S. Application Data

(63) Continuation-in-part of application No. 13/890,262, filed on May 9, 2013, now Pat. No. 9,274,264.

(51) Int. Cl.
| | |
|---|---|
| *F21V 8/00* | (2006.01) |
| *G09G 5/10* | (2006.01) |
| *H01L 33/50* | (2010.01) |
| *H01L 25/075* | (2006.01) |

(52) U.S. Cl.
CPC ............. *G02B 6/005* (2013.01); *G02B 6/001* (2013.01); *G09G 5/10* (2013.01); *H01L 25/075* (2013.01); *H01L 25/0753* (2013.01); *H01L 33/50* (2013.01); *H01L 33/502* (2013.01)

(58) Field of Classification Search
None
See application file for complete search history.

(56) References Cited

U.S. PATENT DOCUMENTS

| | | | |
|---|---|---|---|
| 2004/0012027 A1* | 1/2004 | Keller | H01L 33/50 257/79 |
| 2009/0195494 A1* | 8/2009 | Ueda | G09G 3/3406 345/102 |
| 2010/0123155 A1 | 5/2010 | Pickett et al. | |
| 2010/0244731 A1* | 9/2010 | Kaihotsu | H01L 25/0753 315/294 |

(Continued)

FOREIGN PATENT DOCUMENTS

| | | |
|---|---|---|
| CN | 101515046 | 8/2009 |
| TW | 201234646 | 8/2012 |
| TW | M440469 | 11/2012 |

OTHER PUBLICATIONS

"Office Action of United States Counterpart Application", issued on Dec. 18, 2014, p. 1-p. 16.

(Continued)

*Primary Examiner* — Steven Loke
*Assistant Examiner* — Juanita Rhodes
(74) *Attorney, Agent, or Firm* — Jianq Chyun IP Office

(57) ABSTRACT

A light source module and an electronic device are provided. The light source module includes a light guiding plate, at least one light-emitting element and a quantum dot element. The light guiding plate has a light incident surface and a light emitting surface. The at least one light-emitting element is disposed on the light incident surface to provide a first light beam, and includes yttrium aluminum garnet (YAG). The quantum dot element is disposed on the light emitting surface of the light guiding plate, and is configured to transfer part of the first light into a first monochromatic light. White light can be obtained by mixing by the first light and the first monochromatic light.

14 Claims, 4 Drawing Sheets

(56) References Cited

U.S. PATENT DOCUMENTS

| | | |
|---|---|---|
| 2011/0186811 A1 | 8/2011 | Coe-Sullivan et al. |
| 2012/0113672 A1* | 5/2012 | Dubrow ............... B82Y 20/00 362/602 |
| 2013/0050612 A1 | 2/2013 | Hur et al. |
| 2013/0271948 A1* | 10/2013 | Chang ............... G02B 6/0011 362/23.03 |
| 2013/0335677 A1* | 12/2013 | You ............... G02F 1/133609 349/65 |
| 2014/0264359 A1* | 9/2014 | Zimmerman ........... H01L 33/64 257/76 |

OTHER PUBLICATIONS

"Office Action of Taiwan Counterpart Application", issued on Apr. 20, 2015, p. 1-p. 8.

"Notice of Allowance of Related U.S. Appl. No. 13/890,262," issued on Nov. 30, 2015, p. 1-p. 11.

"Office Action of China Counterpart Application", issued on Jun. 3, 2016, pp. 1-6.

* cited by examiner

LIGHT SOURCE MODULE AND ELECTRONIC DEVICE

CROSS-REFERENCE TO RELATED APPLICATION

This application claims the priority benefits of U.S. application Ser. No. 13/890,262, filed on May 9, 2013. The entirety of the above-mentioned patent application is hereby incorporated by reference herein and made a part of this specification.

BACKGROUND OF THE INVENTION

1. Field of the Invention

The invention relates to a light source module and an electronic device, and particularly to a light source module and an electronic device with a quantum dot element therein.

2. Description of Related Art

Generally, a light-emitting device equipped with a wide color gamut display can adopt a blue light light-emitting diode chip with a quantum dot element. The quantum dots are materials having good characteristics on absorbing and emitting lights. They possess narrow full width of half-maximum (FWHM), high emitting efficiency, relatively wide absorption spectroscopy, and relatively high color purity and color saturation. Therefore, the quantum dot elements are applied to techniques related to display panels, so that the images in display devices have wide color gamut and high color saturation. However, bluish regions often appear on the edge region of display panels, so as to influence the quality of the images.

SUMMARY OF THE INVENTION

Accordingly, a light source module is provided in an embodiment of the invention, and the light source module may have good color saturation.

An electronic device is provided in an embodiment of the invention, and the electronic device may have high color saturation and good quality of the display images.

A light source module of an embodiment of the invention includes a light guiding plate, at least one light-emitting element and a quantum dot element. The light guiding plate has a light incident surface and a light emitting surface. The at least one light-emitting element is disposed on the light incident surface to provide a first light, and at least one light-emitting element includes yttrium aluminum garnet (YAG). The quantum dot element is disposed on the light emitting surface of the light guiding plate, and is configured to transfer part of the first light into a first monochromatic light. White light can be obtained by mixing by the first light and the first monochromatic light.

A light source module of an embodiment of the invention includes a light guiding plate, at least one light-emitting element, an optical element and a quantum dot element. The light guiding plate has a light incident surface, a side surface and a light emitting surface, wherein the light incident surface and the side surface are connected to the light emitting surface. The at least one light-emitting element is disposed on the light incident surface, and is configured to provide a first light. The optical element is disposed on the side surface, and is configured to decrease the intensity of a blue light which irradiates the optical element and then is reflected by the optical element. The quantum dot element is disposed on the light emitting surface of the light guiding plate, and is configured to transfer part of the first light into a first monochromatic light. White light can be obtained by mixing by the first light and the first monochromatic light.

An electronic device of an embodiment of the invention includes a body, the above mentioned light source module, a display panel and a processor. The light source module is disposed in the body. The display panel has a central region and an edge region next to the central region. The processor is electrically connected to the display panel, and is configured to drive the edge region of the display panel according to a first set of gamma curve and drive the central region of the display panel according to a second set of gamma curve.

The color intensity of the first light corresponding to the first set of gamma curves is lower than a color intensity of the first light corresponding to the second set of gamma curves.

In light of the foregoing descriptions, the light source module and the electronic device in the invention are capable of improving the appearance of bluish regions on the edge region of the display panel, so as to achieve high color saturation, wide color gamut, and good quality of the display images at the same time.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
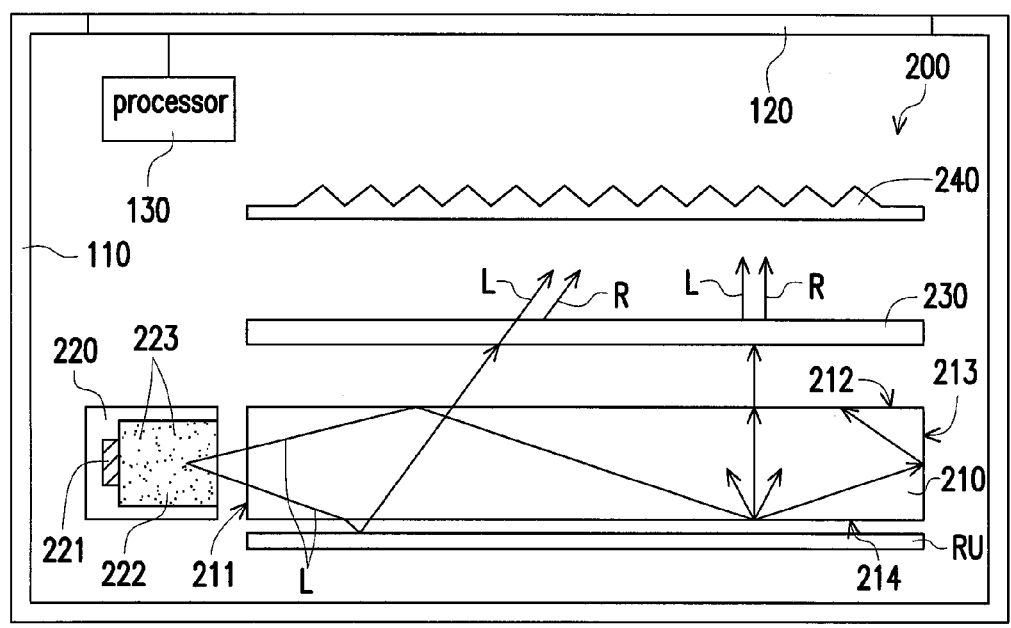
FIG. 1 is an architecture diagram of an electronic device according to an embodiment of the invention.
Figure 2:
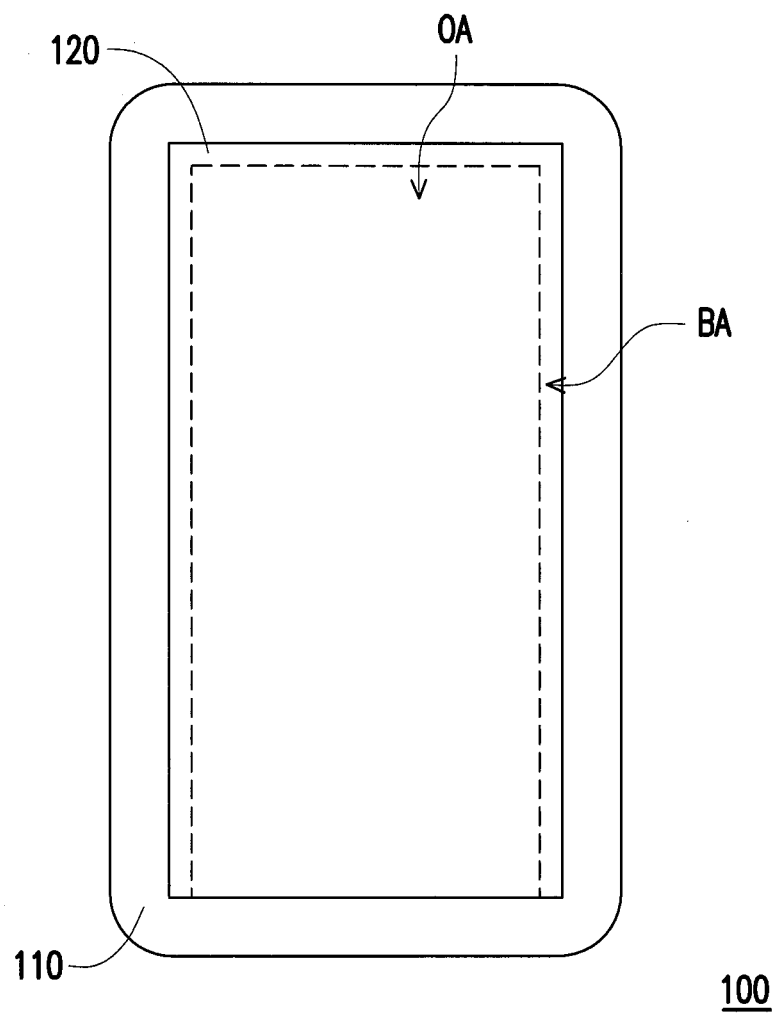
FIG. 2 is a front view of the electronic device shown in FIG. 1.

FIG. 1 is an architecture diagram of an electronic device according to an embodiment of the invention. FIG. 2 is a front view of the electronic device as shown in FIG. 1. Referring to FIG. 1, an electronic device 100 includes a body 110, a light source module 200, a display panel 120 and a processor 130. The light source module 200 is disposed inside the body 110 and includes a light guiding plate 210, at least one light-emitting element 220 and a quantum dot element 230. In the embodiment, the light source module 200 may be a display light source required in a cell phone or a tablet computer. For example, as shown in FIG. 1, the light guiding plate 210 has a light incident surface 211, a side surface 213 and a light emitting surface 212, wherein the light incident surface 211 and the side surface 213 are both connected to the light emitting surface 212. At least one light-emitting element 220 is disposed on the light incident surface 211, and is configured to provide a first light L.

Specifically, in the embodiment, the light-emitting element 220 includes a blue light light-emitting diode chip (blue light LED chip) 221, a green light phosphor 222 and yttrium aluminum garnet (YAG) 223. The green light phosphor 222 is encapsulated in the light-emitting element 220 and located between the blue light LED chip 221 and the light guiding plate 210, and is configured to transfer a blue light provided by the blue light LED chip 221 into a green light. Therefore, the light-emitting element 220 can provide a blue light and a green light. In other words, in the embodiment, the first light L includes a blue light and a green light. When the light-emitting element 220 emits lights, the first light L can enter the light guiding plate 210 through the incident light surface 211, and behaves in total reflection manner while travelling in the light guiding plate 210. On the other hand, the bottom surface 214 of the light guiding plate 210 can also have a scattering structure, so as to destroy the total reflection manner of the first light L. The light source module 200 can also reflect the first light L again back to the light guiding plate 210 through a reflecting unit RU disposed under the light guiding plate 210, so as to let the first light L leave the light guiding plate 210 via the light emitting surface 212.

In addition, as shown in FIG. 1 and FIG. 2, the YAG 223 of the light-emitting element 220 is encapsulated in the light-emitting element 220, located between the blue light LED chip 221 and the light guiding plate 210, and is able to transfer part of the blue light provided by the blue light LED chip 221 into a yellow light. As a result, the first light also includes yellow light. Thus, the first light L may be deviated from the blue color to improve the appearance of bluish regions on the edge region BA of the display panel 120, so that the electronic device 100 can have good display quality.

On the other hand, the quantum dot element 230 is disposed on the light emitting surface 212 of the light guiding plate 210. When the first light L provided by the light-emitting element 220 is emitted from the light emitting surface 212 of the light guiding plate 210 and is transmitted to the display panel 120 through the quantum dot element 230, the quantum dot element 230 can transfer part of the first light L into the first monochromatic light R. In the embodiment, the first monochromatic light R is red light. Then, a white light required by the light source module 200 can be obtained by mixing the first light L and the first monochromatic light R which include blue light and green light. Since the lights transferred by the quantum dot element 230 has the advantage of high saturation, the saturation of red color displayed on the display panel 120 can be enhanced if the first monochromatic light R is transferred by the quantum dot element 230. The doping concentration of the YAG 223 can be arranged to have lower value (e.g. lower than 5%), so as to get lower intensity of yellow light in the first light L comparing to that of blue light and green light in the first light R and the monochromatic light R. As a result, the light source module 200 and the electronic device 100 in the embodiment have simultaneously the high color saturation, the wide color gamut, and good quality of the display images.

In addition, in the embodiment, the green light is provided directly by the first light L of the light-emitting element 220 instead of transferring by the quantum dot element, so that the light source module 200 can have better light utilization and thus having good light intensity. Moreover, as shown in FIG. 1, the light source module 200 can further include at least one brightening film 240, and the quantum dot element 230 is disposed between the brightening film 240 and the light emitting surface 212. The brightening film 240 is able to deflect lights to the front perspective to collect lights and enhance light intensities, so as to further enhance the brightness of the light source module 200.

On the other hand, as shown in FIG. 2, in the embodiment, the display panel 120 has a central region OA and an edge region BA next to the central region OA. The processor 130 is electrically connected to the display panel 120, which is configured to drive the edge region BA of the display panel 120 according to a first set of gamma curve and drive the central region OA of the display panel 120 according to a second set of gamma curve. For example, it is selected that the edge region BA can be driven according to the first set of gamma curve to adjust the blue color on the edge region BA of the display panel 120, and therefore the blue color on the edge region BA becomes insignificant. On the other hand, it is also selected that the central region OA of the display panel 120 is driven according to the second set of gamma curve, so as to proceed a gamma correction to avoid image distortions.

Here, the gamma correction is directed to drive different areas of the display panel 120 respectively (i.e. the edge region BA and the central region OA) through providing different set of gamma curves having different gamma values, and thus match the differences of light intensities and gradation in color. For example, as the brightness layer, which is distinguishable by human eyes, are distributed in a logarithmic way instead of a linear way, and the human vision is more sensitive to distinguish the differences of light intensities among the darker images. Thus, higher gamma values can be selected among darker images to sacrifice the bright layers for the performance of the dark layers. On the contrary, lower gamma values can be selected among brighter images, so as to make the bright layers (e.g. clouds) more obvious. The above mentioned is the principle of gamma correction.

As a result, driving the edge region BA and the central region OA respectively by different first set of gamma curves and second set of gamma curves, the color differences displayed on the edge region BA and the central region OA of the display panel 120 (i.e. the bluish region appears on the edge region BA) can be compensated. For example, in the embodiment, a color intensity of the first light L corresponding to the first set of gamma curve is lower than that of the first light L corresponding to the second set of gamma curve. Here, the first light L is blue light, and therefore the same result can be displayed on different areas (BA, OA) of the display panel 120 without distortion. Thus, the appearance of bluish regions on the edge region BA of the display panel 120 can further be improved, so that the electronic device 100 can have good display quality.

Figure 3:
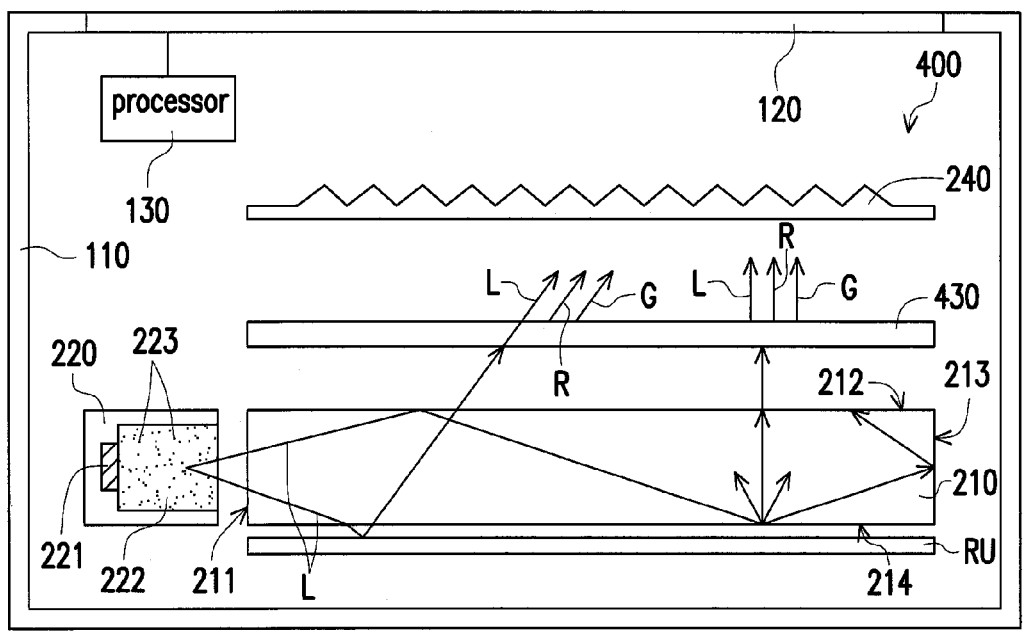
FIG. 3 is an architecture diagram of an electronic device according to another embodiment of the invention.

FIG. 3 is an architecture diagram of an electronic device according to another embodiment of the invention. Referring to FIG. 3, an electronic device 300 and a light source module 400 are similar to the electronic device 100 and the light source module 200 shown in FIG. 1, wherein the differences are described in the following. In this embodiment, a quantum dot element 430 of the light source module 400 is further configured to transfer the other part of the first light L into a second monochromatic light G. In the embodiment, the second monochromatic light G is green light. Then, a white light required by the light source module 400 can be obtained by mixing a first light L composed of blue light and green light, a first monochromatic light R composed of red light in wavelengths, and a second monochromatic light G having green light in wavelengths. Thus, the saturation on red and green colors displayed on the display panel 120 can be enhanced, so that the white light provided by the light source module 400 and the electronic device 300 have the advantage of high color saturation and wide color gamut. In addition, since the light source module 400 can also adjust a blue light in color displayed on the edge region BA of the display panel 120 via yellow light transferred from the YAG 223 of the light-emitting element 220, the colors of the images can avoid from distortion, so that the light source module 400 and the electronic device 300 achieve similar effects and advantages with that of the light source module 200 and the electronic device 100, and therefore no further description is provided herein.

Figure 4A:
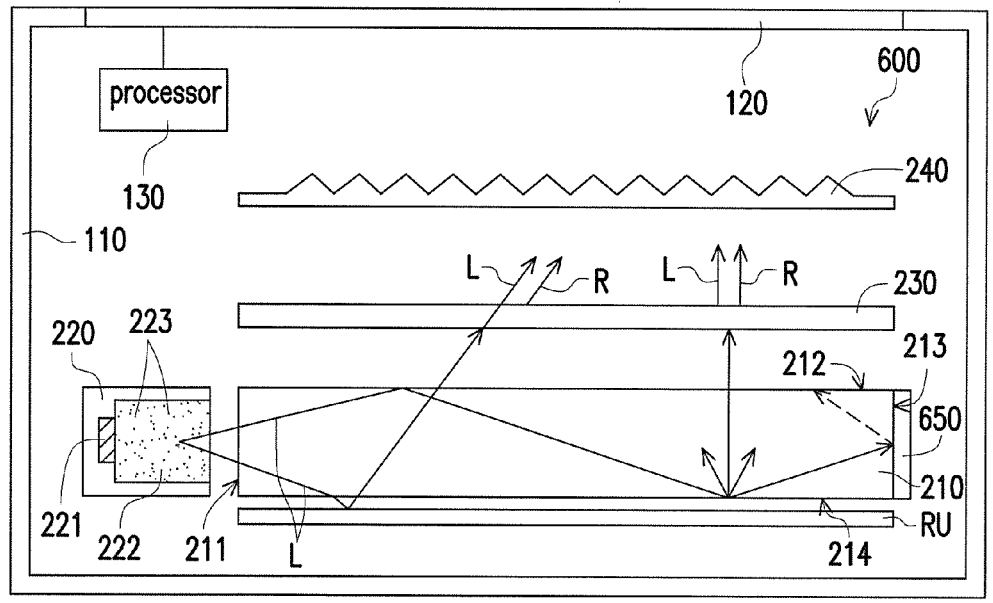
FIG. 4A is an architecture diagram of an electronic device according to another embodiment of the invention.
Figure 4B:
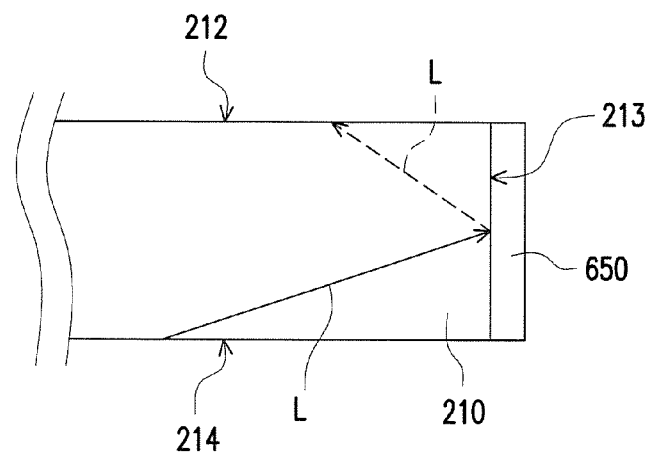
FIG. 4B is a view illustrating the light path in the light guiding plate as shown in FIG. 4A.

FIG. 4A is an architecture diagram of an electronic device according to another embodiment of the invention. FIG. 4B is a view illustrating the light path in the light guiding plate as shown in FIG. 4A. Referring to FIG. 4A and FIG. 4B, an electronic device 500 and a light source module 600 are similar to that of the electronic device 100 and the light source module 200 as shown in FIG. 1, wherein the differences are described in the following. In this embodiment, the light source module 600 can further include an optical element 650. The optical element 650 is disposed on the side surface 213 of the light guiding plate 210, and is configured to decrease the intensity of blue light which irradiates the optical element 650 and then is reflected by the optical element 650. For example, the optical element 650 can be a common glue frame in general optical modules. However, there are some added conditions affecting the selection of materials for the optical element 650. In the embodiment, the optical element 650 can adopt materials which exhibit bad reflection on blue light, are capable of absorbing blue light, or transfer blue light into yellow light. When the light-emitting element 220 emits lights, the intensity of blue light in the first light L which behaves in total reflection manner while travelling the side surface 213 in the light guiding plate 210 can be decreased by the optical element 650. Therefore, the first light L leaving the optical element 650 can also be deviated from the blue to improve the bluish region appears on the edge region BA of the display panel 120, so that the electronic device 500 can have good display quality. In addition, in the embodiment, the blue color appears on the edge region BA of the display panel 120 can be also adjusted by the processor 130 to avoid distortions on colors of the images, so that the light source module 600 and the electronic device 500 achieve similar effects and advantages with that of the light source module 200 and the electronic device 100, and therefore no further description is provided herein.

In summary, in the light source module and the electronic device described in the embodiments of the invention, part of the blue light are transferred into yellow light via the YAG, or the improvements on the situation of appearances of bluish regions on the edge of the images via the optical element and the processor. As a result, the electronic device has simultaneously the high color saturation, the wide color gamut, and good quality of the display images.

Although the application has been described with reference to the above embodiments, it will be apparent to one of the ordinary skill in the art that modifications to the described embodiment may be made without departing from the spirit of the application. Accordingly, the scope of the application will be defined by the attached claims not by the above detailed descriptions.

What is claimed is:

1. A light source module comprising:
   a light guiding plate having a light incident surface and a light emitting surface;
   at least one light-emitting element, disposed on the light incident surface to provide a first light, and the at least one light-emitting element including yttrium aluminum garnet (YAG) and a blue light light-emitting diode chip (blue light LED chip), wherein the YAG is encapsulated in the at least one light-emitting element and located between the blue light LED chip and the light guiding plate; and
   a quantum dot element, disposed on the light emitting surface of the light guiding plate, and configured to transfer part of the first light into a first monochromatic light, wherein white light can be obtained by a mixing of the first light and the first monochromatic light;
   further comprising: an optical element, disposed on a side surface of the light guiding plate, and configured to decrease an intensity of blue light which irradiates the optical element and then is reflected by the optical element, wherein the optical element absorbs blue light or transfers blue light into yellow light.

2. The light source module according to claim 1, wherein the first monochromatic light is red light, and the first light includes blue light and green light.

3. The light source module according to claim 2, wherein the first light further includes yellow light.

4. The light source module according to claim 1, wherein a doping concentration of the YAG is lower than 5%.

5. The light source module according to claim 1, wherein the at least one light-emitting element further includes a green light phosphor, the green light phosphor is encapsulated in the at least one light-emitting element, located between the blue light LED chip and the light guiding plate, and is configured to transfer part of a blue light provided by the blue light LED chip into green light.

6. A light source module comprising:
   a light guiding plate having a light incident surface, a side surface and a light emitting surface, wherein the light incident surface and the side surface are connected to the light emitting surface;
   at least one light-emitting element, disposed on the light incident surface, and configured to provide a first light including blue light; and
   an optical element, disposed on the side surface, and configured to decrease an intensity of blue light which irradiates the optical element and then is reflected by the optical element, wherein the optical element absorbs blue light or transfers blue light into yellow light;
   a quantum dot element, disposed on the light emitting surface of the light guiding plate, and configured to transfer part of the first light into a first monochromatic light, wherein white light can be obtained by a mixing of the first light and the first monochromatic light.

7. The light source module according to claim 6, wherein the first monochromatic light is red light, and the first light includes blue light and green light.

8. An electronic device, comprising:
   a body;
   a light source module according to in claim 1, disposed inside the body;
   a display panel, having a central region and an edge region next to the central region; and
   a processor, electrically connected to the display panel, and configured to drive the edge region of the display panel according to a first set of gamma curves and drive the central region of the display panel according to a second set of gamma curves, wherein a color intensity of the first light corresponding to the first set of gamma curves is lower than a color intensity of the first light corresponding to the second set of gamma curves.

9. An electronic device, comprising:
a body;
a light source module according to in claim 2, disposed inside the body;
a display panel, having a central region and an edge region next to the central region; and
a processor, electrically connected to the display panel, and configured to drive the edge region of the display panel according to a first set of gamma curves and drive the central region of the display panel according to a second set of gamma curves, wherein a color intensity of the first light corresponding to the first set of gamma curves is lower than a color intensity of the first light corresponding to the second set of gamma curves.

10. An electronic device, comprising:
a body;
a light source module according to in claim 3, disposed inside the body;
a display panel, having a central region and an edge region next to the central region; and
a processor, electrically connected to the display panel, and configured to drive the edge region of the display panel according to a first set of gamma curves and drive the central region of the display panel according to a second set of gamma curves, wherein a color intensity of the first light corresponding to the first set of gamma curves is lower than a color intensity of the first light corresponding to the second set of gamma curves.

11. An electronic device, comprising:
a body;
a light source module according to in claim 4, disposed inside the body;
a display panel, having a central region and an edge region next to the central region; and
a processor, electrically connected to the display panel, and configured to drive the edge region of the display panel according to a first set of gamma curves and drive the central region of the display panel according to a second set of gamma curves, wherein a color intensity of the first light corresponding to the first set of gamma curves is lower than a color intensity of the first light corresponding to the second set of gamma curves.

12. An electronic device, comprising:
a body;
a light source module according to in claim 5, disposed inside the body;
a display panel, having a central region and an edge region next to the central region; and
a processor, electrically connected to the display panel, and configured to drive the edge region of the display panel according to a first set of gamma curves and drive the central region of the display panel according to a second set of gamma curves, wherein a color intensity of the first light corresponding to the first set of gamma curves is lower than a color intensity of the first light corresponding to the second set of gamma curves.

13. An electronic device, comprising:
a body;
a light source module according to in claim 6, disposed inside the body;
a display panel, having a central region and an edge region next to the central region; and
a processor, electrically connected to the display panel, and configured to drive the edge region of the display panel according to a first set of gamma curves and drive the central region of the display panel according to a second set of gamma curves, wherein a color intensity of the first light corresponding to the first set of gamma curves is lower than a color intensity of the first light corresponding to the second set of gamma curves.

14. An electronic device, comprising:
a body;
a light source module according to in claim 7, disposed inside the body;
a display panel, having a central region and an edge region next to the central region; and
a processor, electrically connected to the display panel, and configured to drive the edge region of the display panel according to a first set of gamma curves and drive the central region of the display panel according to a second set of gamma curves, wherein a color intensity of the first light corresponding to the first set of gamma curves is lower than a color intensity of the first light corresponding to the second set of gamma curves.

* * * * *